(12) United States Patent
Wang et al.

(10) Patent No.: US 11,164,719 B2
(45) Date of Patent: Nov. 2, 2021

(54) IMAGE CONTRAST ENHANCEMENT IN SAMPLE INSPECTION

(71) Applicant: ASML Netherlands B.V., Veldhoven (NL)

(72) Inventors: Yixiang Wang, Fremont, CA (US); Frank Nan Zhang, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/651,337

(22) PCT Filed: Sep. 25, 2018

(86) PCT No.: PCT/EP2018/075984
§ 371 (c)(1),
(2) Date: Mar. 26, 2020

(87) PCT Pub. No.: WO2019/063558
PCT Pub. Date: Apr. 4, 2019

(65) Prior Publication Data
US 2020/0234915 A1    Jul. 23, 2020

Related U.S. Application Data

(60) Provisional application No. 62/566,195, filed on Sep. 29, 2017.

(51) Int. Cl.
*H01J 37/28* (2006.01)
*H01J 37/26* (2006.01)
(Continued)

(52) U.S. Cl.
CPC ............ *H01J 37/28* (2013.01); *G01N 23/203* (2013.01); *G01N 23/2251* (2013.01);
(Continued)

(58) Field of Classification Search
CPC .. H01J 37/28; H01J 37/261; H01J 2237/0048; H01J 2237/2817; G01N 23/203; G01N 23/2251
See application file for complete search history.

(56) References Cited

U.S. PATENT DOCUMENTS

| 6,943,349 B2 | 9/2005 | Adamec et al. |
| 7,244,949 B2 | 7/2007 | Knippelmeyer et al. |

(Continued)

FOREIGN PATENT DOCUMENTS

| JP | S62-056807 A | 3/1987 |
| JP | H05-151927 A | 6/1993 |

(Continued)

OTHER PUBLICATIONS

International Search Report issued in related PCT International Application No. PCT/EP2018/075984, dated Jan. 7, 2019 (3 pgs.).

(Continued)

*Primary Examiner* — Sean M Luck
(74) *Attorney, Agent, or Firm* — Finnegan, Henderson, Farabow, Garrett & Dunner, LLP

(57) ABSTRACT

Disclosed herein is a method comprising: depositing a first amount of electric charges into a region of a sample, during a first time period; depositing a second amount of electric charges into the region, during a second time period; while scanning a probe spot generated on the sample by a beam of charged particles, recording from the probe spot signals representing interactions of the beam of charged particles and the sample; wherein an average rate of deposition during the first time period and an average rate of deposition during the second time period are different.

13 Claims, 11 Drawing Sheets

(51) Int. Cl.
*G01N 23/203* (2006.01)
*G01N 23/2251* (2018.01)

(52) U.S. Cl.
CPC ..... *H01J 37/261* (2013.01); *H01J 2237/0048* (2013.01); *H01J 2237/2817* (2013.01)

(56) References Cited

U.S. PATENT DOCUMENTS

| | | | |
|---|---|---|---|
| 7,253,410 B1 | 8/2007 | Bertsche et al. | |
| 7,994,476 B2 | 8/2011 | Bullock | |
| 8,294,095 B2 | 10/2012 | Chen et al. | |
| 9,140,656 B2* | 9/2015 | Lechner | H01J 37/28 |
| 9,165,742 B1* | 10/2015 | Simmons | H01J 37/06 |
| 9,607,805 B2 | 3/2017 | Liu et al. | |
| 9,666,412 B1 | 5/2017 | Litman et al. | |
| 2004/0211899 A1 | 10/2004 | Ezumi et al. | |
| 2009/0050802 A1* | 2/2009 | Noji | H01J 37/265 |
| | | | 250/307 |
| 2010/0258722 A1 | 10/2010 | Fang et al. | |
| 2012/0292506 A1 | 11/2012 | Tsuno et al. | |
| 2014/0027635 A1 | 1/2014 | Matsui et al. | |
| 2014/0092231 A1* | 4/2014 | Nakahira | H01J 37/26 |
| | | | 348/80 |
| 2014/0151554 A1* | 6/2014 | Ren | H01J 37/14 |
| | | | 250/310 |
| 2016/0268096 A1 | 9/2016 | Ren et al. | |
| 2016/0284505 A1 | 9/2016 | Ren et al. | |
| 2017/0025241 A1 | 1/2017 | Li et al. | |
| 2017/0025243 A1 | 1/2017 | Ren et al. | |
| 2017/0154756 A1 | 6/2017 | Ren et al. | |

FOREIGN PATENT DOCUMENTS

| | | |
|---|---|---|
| JP | H10-294345 A | 11/1998 |
| JP | 2008-267835 A | 11/2008 |
| JP | 2016-031937 A | 3/2016 |
| JP | 2016-139531 A | 8/2016 |
| WO | WO2011/121875 | 10/2011 |
| WO | WO 2017/132435 A1 | 8/2017 |
| WO | WO 2018/122176 A1 | 7/2018 |

OTHER PUBLICATIONS

Notice of Reasons for Rejection issued in related Japanese Patent Application No. 2020-513841; dated Feb. 3, 2021 (18 pgs.).

* cited by examiner

1999

IMAGE CONTRAST ENHANCEMENT IN SAMPLE INSPECTION

CROSS-REFERENCE TO RELATED APPLICATIONS

This application is a national stage filing under 35 U.S.C. § 371 of International Application No. PCT/EP2018/075984, filed on Sep. 25, 2018, and published as WO 2019/063558 A1, which claims priority of U.S. Provisional Application No. 62/566,195, which was filed on Sep. 29, 2017, all of which are incorporated herein by reference in their entireties.

TECHNICAL FIELD

This disclosure relates to methods and apparatuses for inspecting (e.g., observing, measuring, and imaging) samples such as wafers and masks used in a device manufacturing process such as the manufacture of integrated circuits (ICs).

BACKGROUND

A device manufacturing process may include applying a desired pattern onto a substrate. A patterning device, which is alternatively referred to as a mask or a reticle, may be used to generate the desired pattern. This pattern can be transferred onto a target portion (e.g., including part of, one, or several dies) on the substrate (e.g., a silicon wafer). Transfer of the pattern is typically via imaging onto a layer of radiation-sensitive material (resist) provided on the substrate. A single substrate may contain a network of adjacent target portions that are successively patterned. A lithographic apparatus may be used for this transfer. One type of lithographic apparatus is called a stepper, in which each target portion is irradiated by exposing an entire pattern onto the target portion at one time. Another type of lithography apparatus is called a scanner, in which each target portion is irradiated by scanning the pattern through a radiation beam in a given direction while synchronously scanning the substrate parallel or anti parallel to this direction. It is also possible to transfer the pattern from the patterning device to the substrate by imprinting the pattern onto the substrate.

In order to monitor one or more steps of the device manufacturing process (e.g., exposure, resist-processing, etching, development, baking, etc.), a sample, such as a substrate patterned by the device manufacturing process or a patterning device used therein, may be inspected, in which one or more parameters of the sample may be measured. The one or more parameters may include, for example, edge place errors (EPEs), which are distances between the edges of the patterns on the substrate or the patterning device and the corresponding edges of the intended design of the patterns. Inspection may also find pattern defects (e.g., failed connection or failed separation) and uninvited particles.

Inspection of substrates and patterning devices used in a device manufacturing process can help to improve the yield. The information obtained from the inspection can be used to identify defects, or to adjust the device manufacturing process.

SUMMARY

Disclosed herein is a method comprising: depositing a first amount of electric charges into a region of a sample, during a first time period; depositing a second amount of electric charges into the region, during a second time period; while scanning a probe spot generated on the sample by a beam of charged particles, recording from the probe spot signals representing interactions of the beam of charged particles and the sample; wherein an average rate of deposition during the first time period and an average rate of deposition during the second time period are different.

According to an embodiment, the method further comprises reiterating depositing the first amount of electric charges into the region during the first time period and depositing the second amount of electric charges into the region during the second time period.

According to an embodiment, the first amount or the second amount is zero.

According to an embodiment, the first amount and the second amount are different.

According to an embodiment, a length of the first time period and a length of the second time period are different.

According to an embodiment, the region has a non-uniform spatial distribution of a chemical characteristic or a physical characteristic.

According to an embodiment, the chemical characteristic or the physical characteristic is selected from a group consisting of composition, doping level, electric resistance, electric capacitance, electric inductance, thickness, crystallinity, and permittivity.

According to an embodiment, depositing the first amount of electric charges or depositing the second amount of electric charges is done using the beam of charged particles.

According to an embodiment, depositing the first amount of electric charges or depositing the second amount of electric charges is done using another beam comprising electric charges, instead of using the beam of charged particles.

According to an embodiment, the other beam has a cross-sectional area that is at least 2 times of a cross-sectional area of the beam of charged particles.

According to an embodiment, the region comprises a first sub-region and a second sub-region, wherein a rate of change of an amount of electric charges dissipated from the first sub-region and a rate of change of an amount of electric charges dissipated from the second sub-region are different.

According to an embodiment, the region comprises a first sub-region and a second sub-region, wherein a rate of change of an amount of electric charges deposited into the first sub-region and a rate of change of an amount of electric charges deposited into the second sub-region are the same.

According to an embodiment, the region comprises a first sub-region and a second sub-region, wherein a net rate of change of an amount of electric charges in the first sub-region and a net rate of change of an amount of electric charges in the second sub-region are different.

According to an embodiment, the region comprises a first sub-region and a second sub-region, wherein a net rate of change of an amount of electric charges in the first sub-region or a net rate of change of an amount of electric charges in the second sub-region is negative.

According to an embodiment, the region comprises a first sub-region and a second sub-region, wherein a difference between an amount of electric charges in the first sub-region and an amount of electric charges in the second sub-region increases with time.

According to an embodiment, the region comprises a sub-region, wherein an amount of electric charges in the sub-region is zero during a part of the second time period.

Disclosed herein is a computer program product comprising a non-transitory computer readable medium having instructions recorded thereon, the instructions when executed by a computer implementing any of the above methods.

Disclosed herein is an apparatus configured to inspect a sample, the apparatus comprising: a source of charged particles; a stage; optics configured to direct a beam of the charged particles to a sample supported on the stage; a controller configured to control the source and the optics; and wherein the source, optics and controller are collectively configured to: depositing a first amount of electric charges into a region of the sample, during a first time period; depositing a second amount of electric charges into the region, during a second time period; wherein an average rate of deposition during the first time period and an average rate of deposition during the second time period are different.

According to an embodiment, the apparatus further comprises a detector configured to record signals representing interactions of the beam and the sample.

According to an embodiment, the source, optics and controller are collectively configured to generate the signals.

According to an embodiment, the optics are configured to scan a probe spot formed by the beam on the sample relative to the sample.

According to an embodiment, the stage is configured to move the sample.

DETAILED DESCRIPTION

There are various techniques for inspecting the sample (e.g., a substrate and a patterning device). One kind of inspection techniques is optical inspection, where a light beam is directed to the substrate or patterning device and a signal representing the interaction (e.g., scattering, reflection, diffraction) of the light beam and the sample is recorded. Another kind of inspection techniques is charged particle beam inspection, where a beam of charged particles (e.g., electrons) is directed to the sample and a signal representing the interaction (e.g., secondary emission and back-scattered emission) of the charged particles and the sample is recorded.

As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

Figure 1:
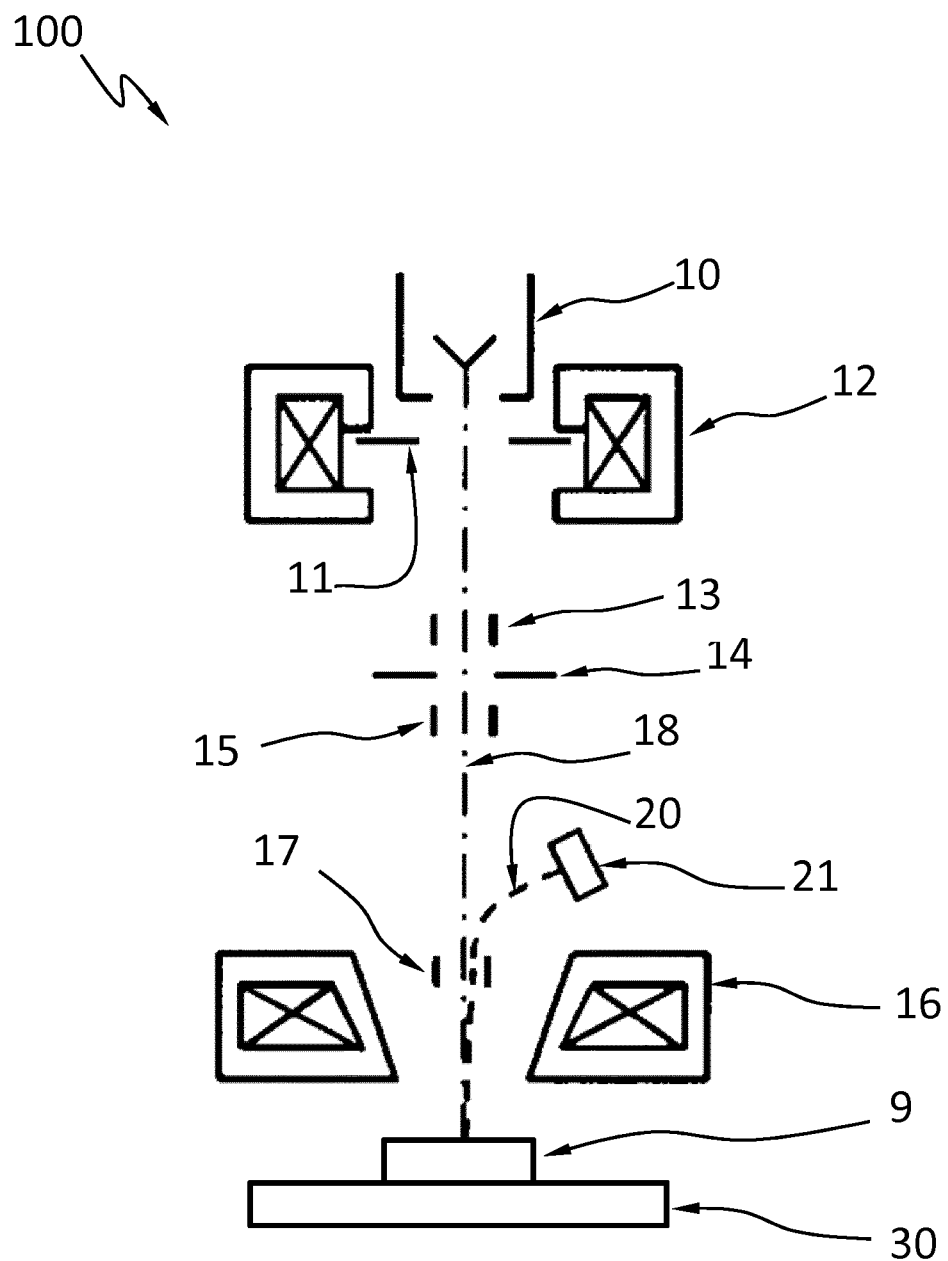
FIG. 1 schematically shows an apparatus that can carry out charged particle beam inspection.

FIG. 1 schematically shows an apparatus 100 that can carry out charged particle beam inspection. The apparatus 100 may include components configured to generate and control a beam of charged particles, such as a source 10 that can produce charged particles in free space, a beam extraction electrode 11, a condenser lens 12, a beam blanking deflector 13, an aperture 14, a scanning deflector 15, and an objective lens 16. The apparatus 100 may include components configured to detect the signal representing the interaction of the beam of charged particles and a sample, such as an E×B charged particle detour device 17, a signal detector 21. The apparatus 100 may also include components, such as a processor, configured to process the signal or control the other components.

In an example of an inspection process, a beam 18 of charged particle is directed to a sample 9 (e.g., a wafer or a mask) positioned on a stage 30. A signal 20 representing the interaction of the beam 18 and the sample 9 is guided by the E×B charged particle detour device 17 to the signal detector 21. The processor may cause the stage 30 to move or cause the beam 18 to scan.

Charged particle beam inspection may have higher resolution than optical inspection due to the shorter wavelengths of the charged particles used in charged particle beam inspection than the light used in optical inspection. As the dimensions of the patterns on the substrate and the patterning device become smaller and smaller as the device manufacturing process evolves, charged particle beam inspection becomes more widely used.

In an example, multiple beams of charged particles can simultaneously scan multiple regions on a sample. The scanning of the multiple beams may be synchronized or independent. The multiple regions may have overlaps among them, may be tiled to cover a continuous area, or may be isolated from one another. Signals generated from the interactions of the beams and the sample may be collected by multiple detectors. The number of detectors may be less than, equal to, or greater than the number of the beams. The multiple beams may be individually controlled or collectively controlled.

Multiple beams of charged particles may form multiple probe spots on a surface of a sample. The probe spots can respectively or simultaneously scan multiple regions on the surface. The charged particles of the beams may generate signals from the locations of the probe spots. One example of the signals is secondary electrons. Secondary electrons usually have energies less than 50 eV. Another example of the signals is backscattered electrons when the charged particles of the beams are electrons. Backscattered electrons usually have energies close to landing energies of the electrons of the beams. The signals from the locations of the probe spots may be respectively or simultaneously collected by multiple detectors.

The multiple beams may be from multiple sources respectively, or from a single source. If the beams are from multiple sources, multiple columns may scan and focus the beams onto the surface, and the signals generated by the beams may be detected by detectors in the columns, respectively. An apparatus using beams from multiple sources may be called as a multi-column apparatus. The columns can be either independent or share a multi-axis magnetic or electromagnetic-compound objective lens. See U.S. Pat. No. 8,294,095, whose disclosure is hereby incorporated by reference in its entirety. The probe spots generated by a multi-column apparatus may be spaced apart by a distance as large as 30-50 mm.

If the beams are from a single source, a source-conversion unit may be used to form multiple virtual or real images of the single source. Each of the images and the single source may be viewed as an emitter of a beam (also called a "beamlet" as all of the beamlets are from the same source). The source-conversion unit may have an electrically conductive layer with multiple openings that can divide the charged particles from the single source into multiple beamlets. The source-conversion unit may have optics elements that can influence the beamlets to form multiple virtual or real images of the single source. Each of the images can be viewed as a source that emits one of the beamlets. The beamlets may be spaced apart by a distance of micrometers. A single column, which may have a projection system and a deflection scanning unit, may be used to scan and focus the beamlets on multiple regions of a sample. The signals generated by the beamlets may be respectively detected by multiple detection elements of a detector inside the single column. An apparatus using beams from a single source may be called as a multi-beam apparatus.

There are at least two methods to form the images of the single source. In the first method, each optics element has an electrostatic micro-lens that focuses one beamlet and thereby forms one real image. See, e.g., U.S. Pat. No. 7,244,949, whose disclosure is hereby incorporated by reference in its entirety. In the second method, each optics element has an electrostatic micro-deflector which deflects one beamlet thereby forms one virtual image. See, e.g., U.S. Pat. No. 6,943,349 and U.S. patent application Ser. No. 15/065,342, whose disclosures are hereby incorporated by reference in their entirety. Interactions (e.g., the Coulomb effect) among the charged particles in the second method may be weaker than that in the first method because a real image has a higher current density.

Figure 2A:
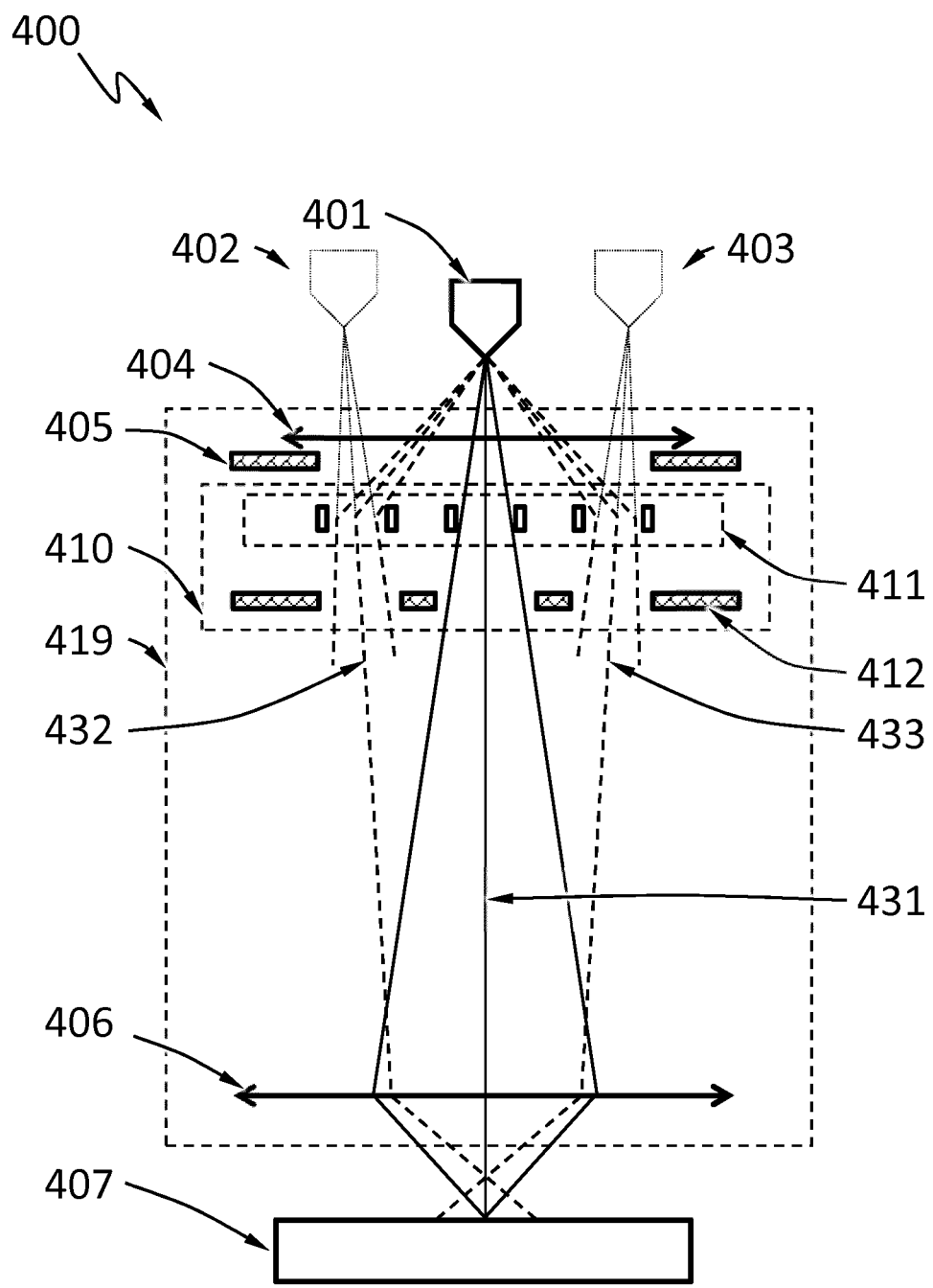
FIG. 2A schematically shows an apparatus that can carry out charged particle beam inspection using multiple beams of charge particles, where the charged particles in the multiple beams are from a single source (a "multi-beam" apparatus).

FIG. 2A schematically shows an apparatus 400 that can carry out charged particle beam inspection using multiple beams of charge particles, where the charged particles in the multiple beams are from a single source. Namely, the apparatus 400 is a multi-beam apparatus. The apparatus 400 has a source 401 that can produce charged particles in free space. In an example, the charged particles are electrons and the source 401 is an electron gun. The apparatus 400 has an optics system 419 that can generate with the charged particles multiple probe spots on a surface of a sample 407 and scan the probe spots on the surface of the sample 407. The optics system 419 may have a condenser lens 404 and a main aperture 405 upstream or downstream with respect to the condenser lens 404. The expression "Component A is upstream with respect to Component B" as used herein means that a beam of charged particles would reach Component A before reaching Component B in normal operation of the apparatus. The expression "Component B is downstream with respect to Component A" as used herein means that a beam of charged particles would reach Component B after reaching Component A in normal operation of the apparatus. The optics system 419 has a source-conversion unit 410 configured to form multiple virtual images (e.g., virtual images 402 and 403) of the source 401. The virtual images and the source 401 each can be viewed as an emitter of a beamlet (e.g., beamlets 431, 432 and 433). The source-conversion unit 410 may have an electrically conductive layer 412 with multiple openings that can divide the charged particles from the source 401 into multiple beamlets, and optics elements 411 that can influence the beamlets to form the virtual images of the source 401. The optics elements 411 may be micro-deflectors configured to deflect the beamlets. The electric current of the beamlets may be affected by the sizes of the openings in the electrically conductive layer 412 or the focusing power of the condenser lens 404. The optics system 419 includes an objective lens 406 configured to focus the multiple beamlets and thereby form multiple probe spots onto the surface of the sample 407. The source-conversion unit 410 may also have micro-compensators configured to reduce or eliminate aberrations (e.g., field curvature and astigmatism) of the probe spots.

Figure 2B:
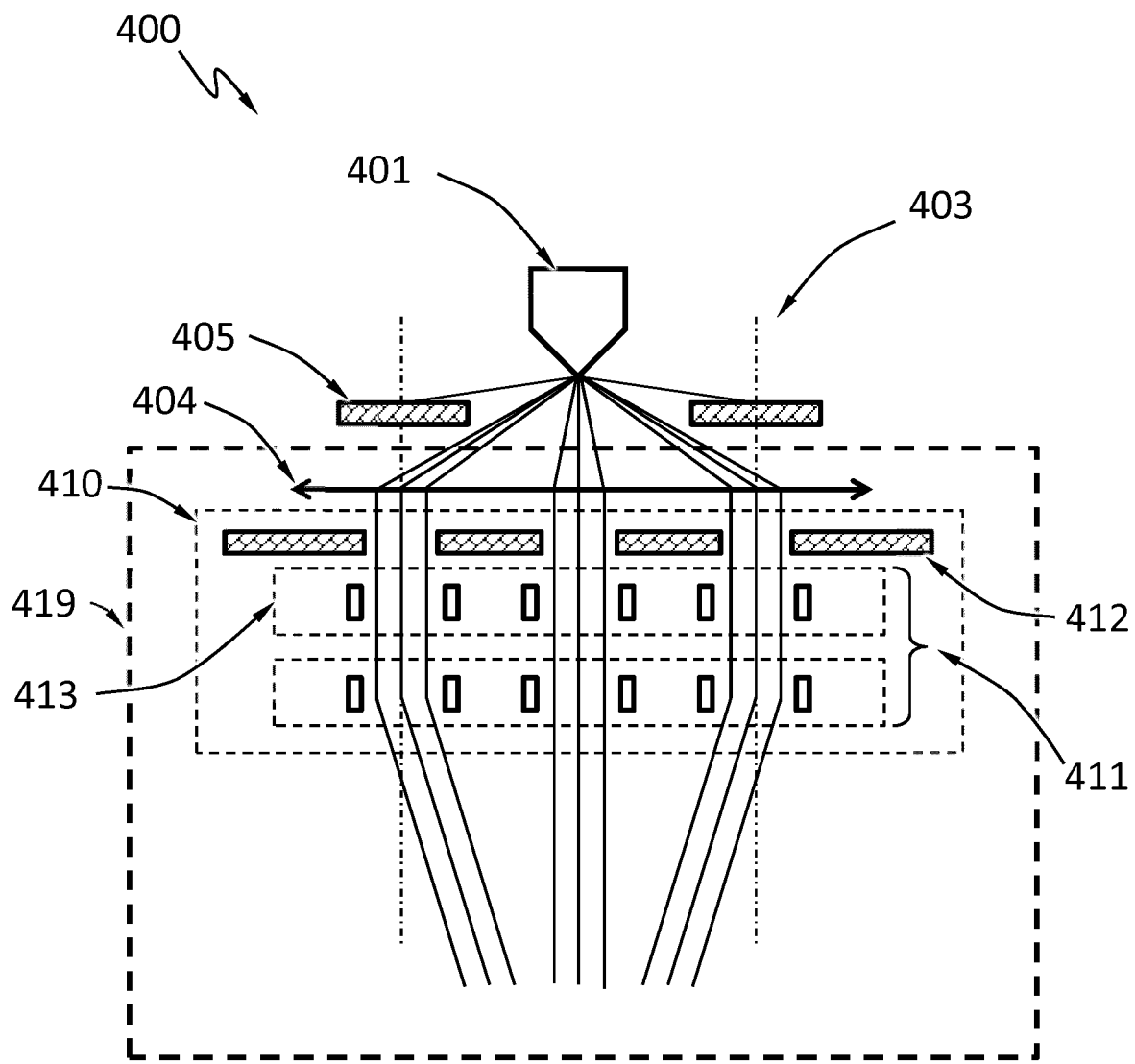
FIG. 2B schematically shows an alternative multi-beam apparatus.

FIG. 2B schematically shows an alternative multi-beam apparatus. The condenser lens 404 collimates the charged particles from the source 401. The optics elements 411 of the source-conversion unit 410 may comprise micro-compensators 413. The micro-compensators 413 may be separate from micro-deflectors or may be integrated with micro-deflectors. If separated, the micro-compensators 413 may be positioned upstream to the micro-deflectors. The micro-compensators 413 are configured to compensate for off-axis aberrations (e.g., field curvature, astigmatism and distortion) of the condenser lens 404 or the objective lens 406. The off-axis aberrations may negatively impact the sizes or positions of the probe spots formed by off-axis (i.e., being not along the primary optical axis of the apparatus) beamlets. The off-axis aberrations of the objective lens 406 may not be completely eliminated by deflection of the beamlets. The micro-compensators 413 may compensate for the residue off-axis aberrations (i.e., the portion of the off-axis aberrations that cannot be eliminated by deflection of the beamlets) of the objective lens 406, or non-uniformity of the sizes of the probe spots. Each of the micro-compensators 413 is aligned with one of the openings in the electrically conductive layer 412. The micro-compensators 413 may each have four or more poles. The electric currents of the beamlets may be affected by the sizes of the openings in the electrically conductive layer 412 and/or the position of the condenser lens 404.

Figure 2C:
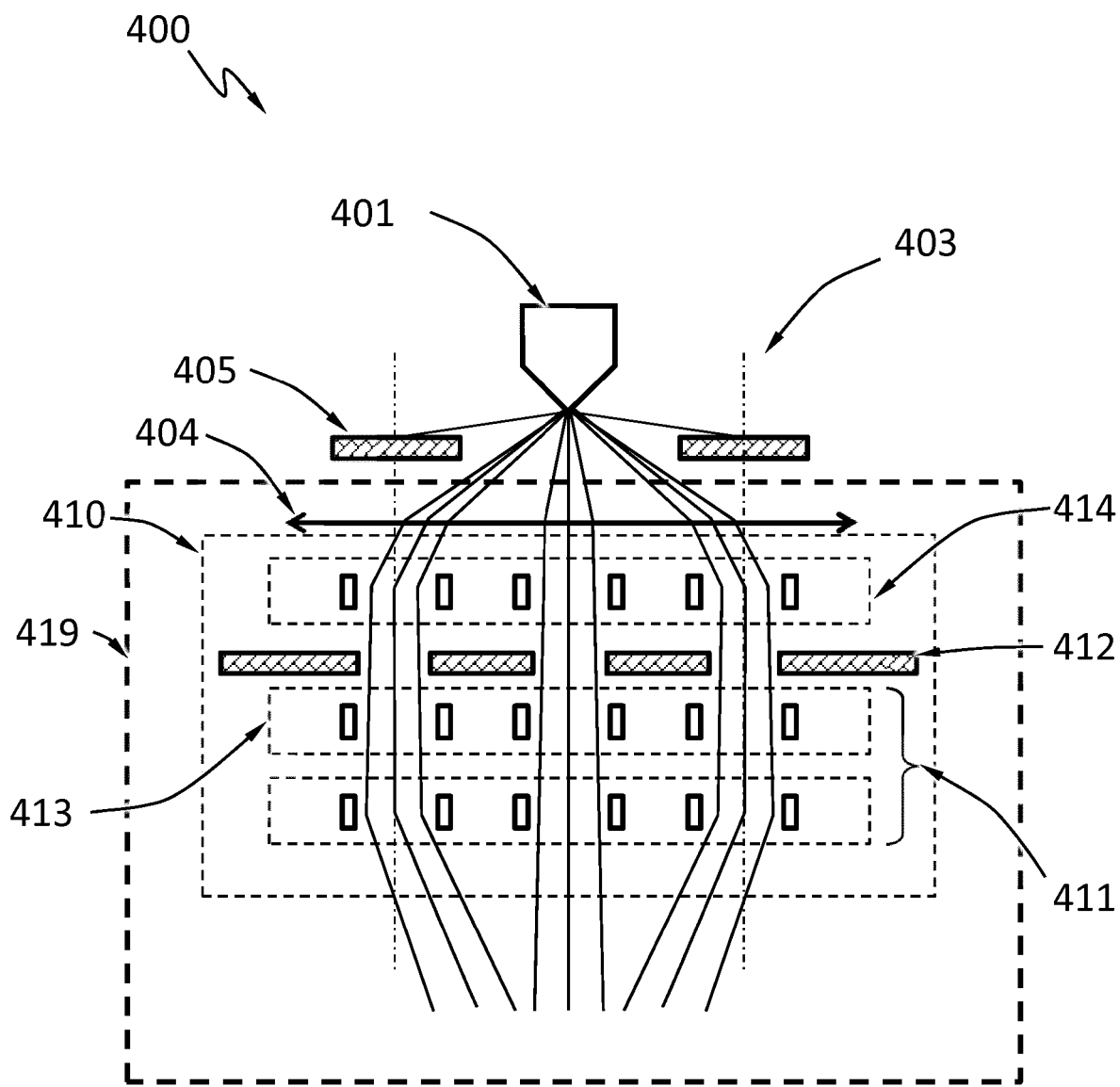
FIG. 2C schematically shows an alternative multi-beam apparatus.

FIG. 2C schematically shows an alternative multi-beam apparatus. The optics elements 411 of the source-conversion unit 410 may comprise pre-bending micro-deflectors 414. The pre-bending micro-deflectors 414 are micro-deflectors configured to bend the beamlets before they go through the openings in the electrically conductive layer 412.

Additional descriptions of apparatuses using multiple beams of charge particles from a single source may be found in U.S. Patent Application Publications 2016/0268096, 2016/0284505 and 2017/0025243, U.S. Pat. No. 9,607,805, U.S. patent application Ser. Nos. 15/365,145, 15/213,781, 15/216,258 and 62/440,493, and PCT Application PCT/US17/15223, the disclosures of which are hereby incorporated by reference in their entirety.

When a region of a sample (e.g., a substrate or a patterning device) is inspected with a beam of charged particles, a signal representing the interactions of the beam and the sample is recorded from the probe spot formed by the beam in the region. The interactions represented by the signal may include interactions of the charged particles of the beam and electric charges in the sample. The electric charges that may interact with the charged particles of the beam may be inside the sample. Therefore, the spatial distribution of the electric charges in the sample may be used to produce spatial contrast in the signals.

Figure 3:
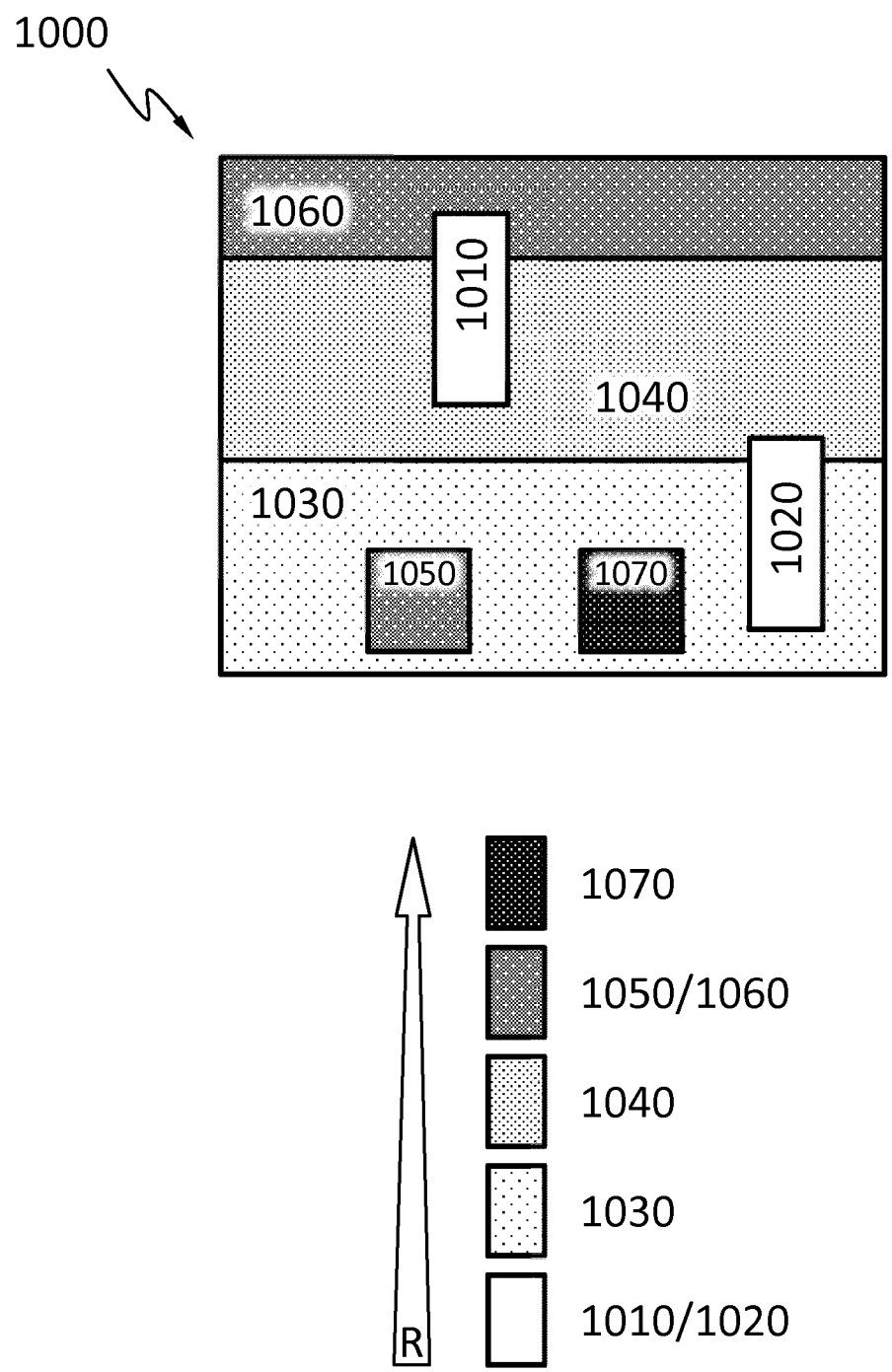
FIG. 3 schematically shows a region of a sample, as an example.

The spatial distribution of the electric charges may vary significantly in the sample. The spatial distribution of chemical and physical characteristics in the sample may affect the spatial distribution of the electric charges. Examples of these characteristics may include composition, doping level, electric resistance, electric capacitance, electric inductance, thickness, crystallinity, permittivity, etc. FIG. 3 schematically shows a region 1000 of a sample, as an example. The region 1000 includes several sub-regions 1010-1070 that may have differences in one or more chemical and physical characteristics. In this example, sub-regions 1010-1070 have different electric resistance. In this example, sub-region 1070 is a thick metal layer; sub-region 1050 and sub-region 1060 are thin metal layers; sub-region 1040 is a lightly-doped semiconductor layer; sub-region 1030 is a thin dielectric layer; and sub-region 1020 and sub-region 1010 are thick dielectric layers. The order of the electric resistances of the sub-regions 1010-1070 is schematically shown in FIG. 3. The differences in the electric resistance among the sub-regions 1010-1070 may produce spatial contrast in signals representing the interactions of a beam of charged particles and the sample.

In an example, electric charges may dissipate faster from a sub-region with a smaller electric resistance than from a sub-region with a greater electric resistance. If the sub-region with the smaller electric resistance and the sub-region with the greater electric resistance start with the same amount of electric charges, the sub-region with the smaller electric resistance may have fewer electric charges than the sub-region with the greater electric resistance after a finite time period. Therefore, after the finite time period, the interactions of the beam of charged particles and the sub-region with the greater electric resistance may be different from the interactions of the beam of charged particles and the sub-region with the smaller electric resistance. A spatial contrast in the signals representing these interactions thus may be produced.

One particular use of the electric resistance to produce spatial contrast in the signals representing the interactions of the beam of charged particles and the sample is to detect certain defects. For example, a deep via with a defective conductive path has a higher electric resistance than a similar deep vias with a normal conductive path. The contrast in the signals thus may reveal defects such as a deep via with a defective conductive path.

Figure 4:
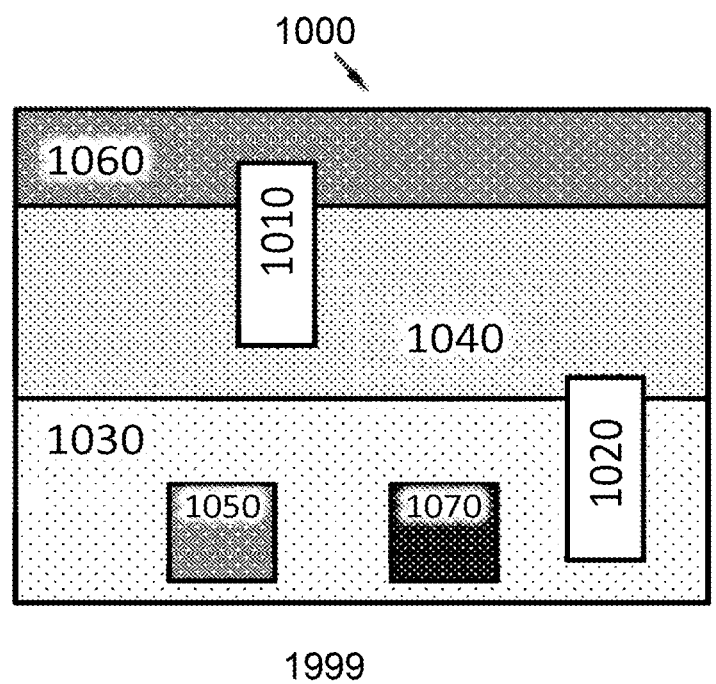
FIG. 4 schematically shows an example of using the chemical and physical characteristics in the sample to produce spatial contrast in signals representing interactions of a beam of charged particles and the sample.
Figure 4:
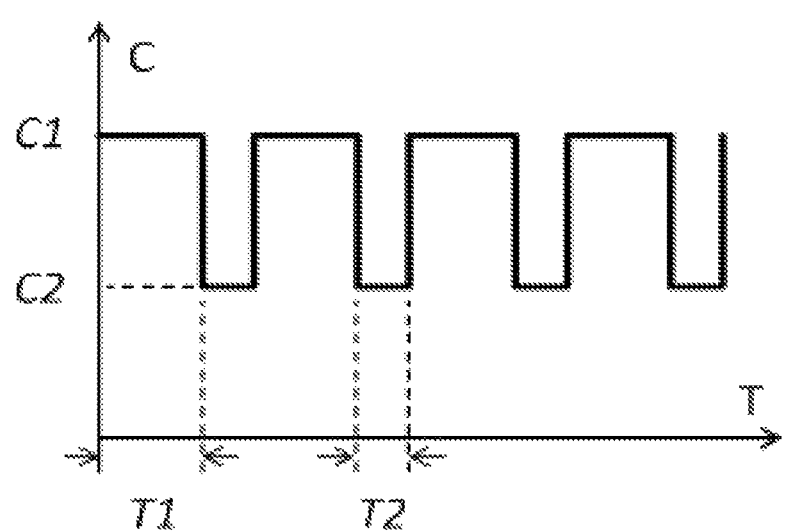

FIG. 4 schematically shows an example of using the chemical and physical characteristics (e.g., the electric resistance as in FIG. 3) in the sample to produce spatial contrast in signals representing interactions of a beam of charged particles and the sample. Electric charges may be deposited onto the region 1000, for example, using an expanded beam 1999 that includes electric charges. The expanded beam 1999 may or may not be large enough to encompass the entirety of the region 1000. The expanded beam 1999 may be scanned across the region 1000. The electric charges of the expanded beam 1999 may be carried by the same particles as or different particles from the charged particles of the beam for inspecting the sample. The electric current carried by the expanded beam 1999 may be modulated as shown in FIG. 4. For example, the electric current carried by the expanded beam 1999 may be at a higher value C1 during a timer period T1 and at a lower value C2 during a time period T2 following the time period T1. Although a square waveform is shown in this example, the electric current carried by the expanded beam 1999 may have other suitable waveforms. After electric charges are deposited onto the region 1000, the amounts of the electric charges in the sub-regions may become different over time due to their differences in the electric resistance. The differences of the amounts of the electric charges in the sub-regions may be affected by the characteristics of the modulated deposition of electric charges, such as C1, C2, T1 and T2.

FIG. 5A-FIG. 5D, FIG. 6A-FIG. 6D and FIG. 7A-FIG. 7D schematically show examples to illustrate the impact of the characteristics of the deposition of electric charges on the inspection. Simplification is made in the figures and they may not show all the physical mechanisms behind the deposition and dissipation of the electric charges on the sample. For example, the dissipation rate is approximated to be independent to the amount of electric charges on the sample.

Figure 5A:
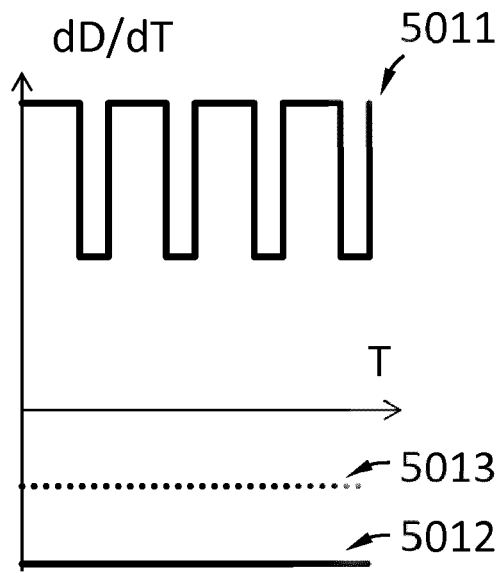
FIG. 5A-FIG. 5D, FIG. 6A-FIG. 6D and FIG. 7A-FIG. 7D schematically show examples to illustrate the impact of the characteristics of the deposition of electric charges on the inspection.
Figure 5B:
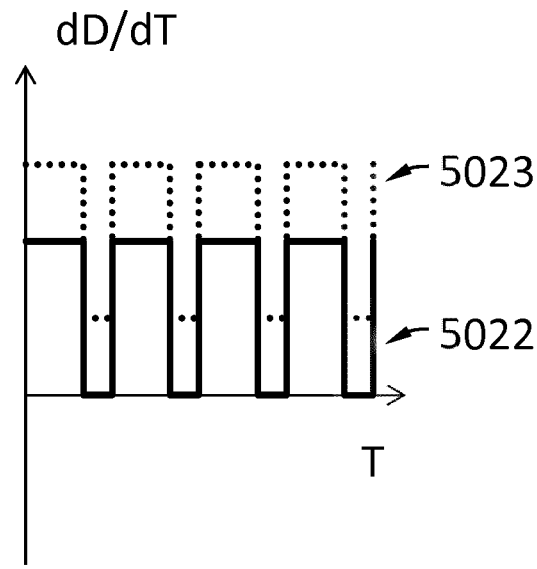
Figure 5C:
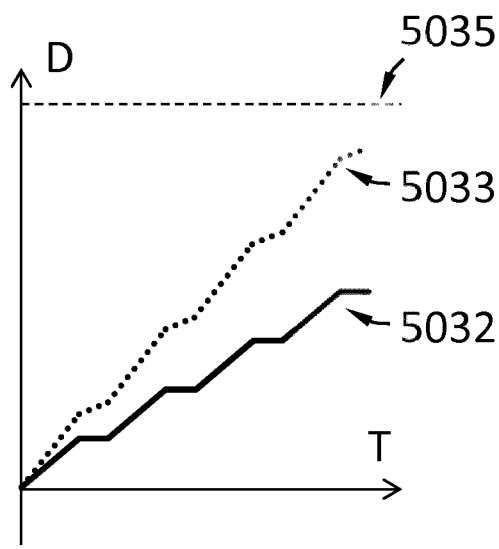
Figure 5D:
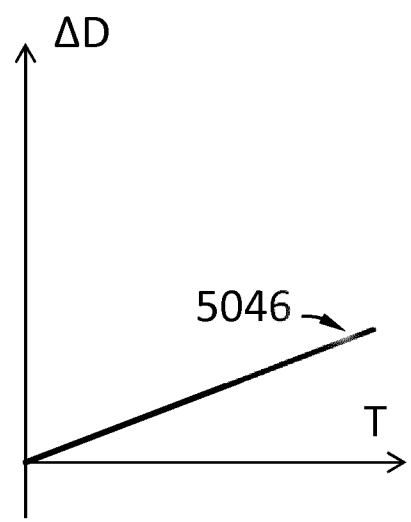

FIG. 5A shows the rate of change 5011 of the amount of electric charges deposited into two sub-regions 1050 and 1070 of the region 1000, the rate of change 5012 of the amount of electric charges dissipated from sub-region 1070, and the rate of change 5013 of the amount of electric charges dissipated from sub-region 1050. The rate of change 5012 of the amount of electric charges dissipated from sub-region 1070 is higher in its absolute value than the rate of change 5013 of the amount of electric charges dissipated from sub-region 1050 because sub-region 1070 has a lower electric resistance than sub-region 1050, as shown in FIG. 3. FIG. 5B shows the net rate of change 5022 of the amount of electric charges in sub-region 1070, and the net rate of change 5023 of the amount of electric charges in sub-region 1050. The net rate of change 5022 is the sum of the rate of change 5011 and the rate of change 5012. The net rate of change 5023 is the sum of the rate of change 5011 and the rate of change 5013. FIG. 5C shows the amount of electric charges 5033 in sub-region 1050 as a function of time T and the amount of electric charges 5032 in sub-region 1070 as a function of time T, assuming that sub-regions 1050 and 1070 have zero electric charge when T is zero. The amounts of electric charges 5032 and 5033 may be derived by integrating the net rate of changes 5022 and 5023 with respect to time T. FIG. 5C also shows the maximum 5035 of the amount of electric charges of each of sub-regions 1050 and 1070. If the amount of charges in sub-region 1050 or sub-region 1070 exceeds the maximum 5035, an undesirable effect may occur (e.g., structures in sub-region 1050 or sub-region 1070 may be damaged). FIG. 5D shows the difference 5046 between the amount of electric charges in sub-region 1050 and the amount of electric charges in sub-region 1070, as a function of time T. FIG. 5C and FIG. 5D indicate that the difference 5046 may increase with time T, as a result of the modulation in the rate of change 5011 of the amount of electric charges deposited into sub-regions 1050 and 1070 and the disparity in the rate of change 5012 of the amount of electric charges dissipated from sub-region 1070 and the rate of change 5013 of the amount of electric charges dissipated from sub-region 1050. The presence of the maximum 5035 limits the length of time of the deposition of the electric charges into sub-regions 1050 and 1070, and thus limits the difference 5046 between the amount of electric charges in sub-region 1050 and the amount of electric charges in sub-region 1070. The expanded beam 1999 shown in FIG. 4 may be used to produce the rate of change 5011 in FIG. 5A. For example, when C2 is about half of C1 and T2 is about half the length of T1, the expanded beam 1999 can produce the rate of change 5011 in FIG. 5A.

In the example shown in FIG. 5A-FIG. 5D, the difference 5046 can reach about ⅖ of the maximum 5035.

Figure 6A:
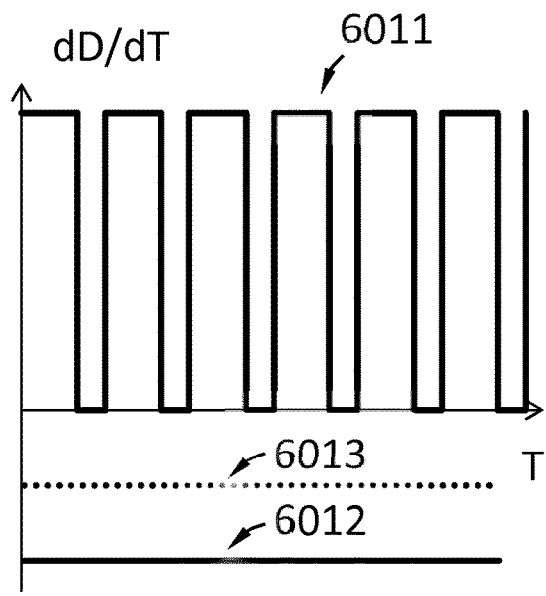
Figure 6B:
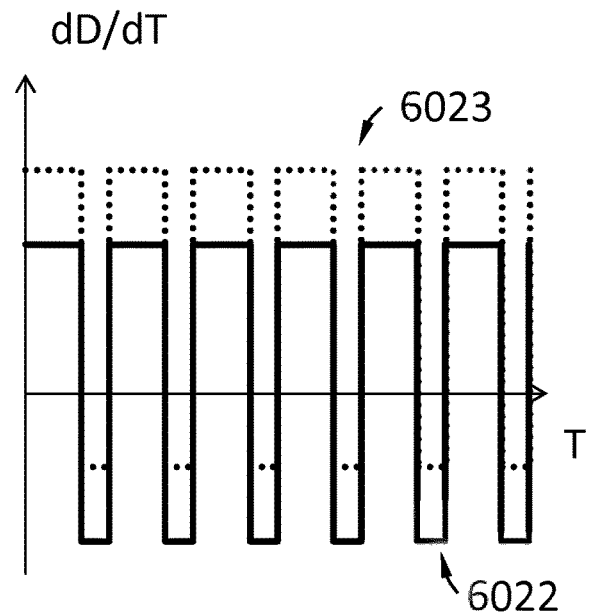
Figure 6C:
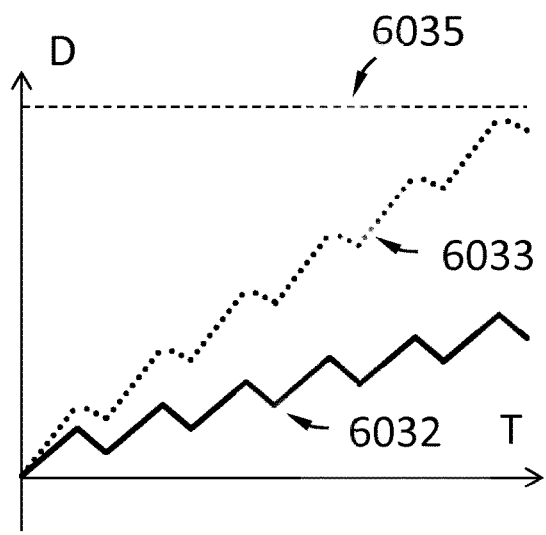
Figure 6D:
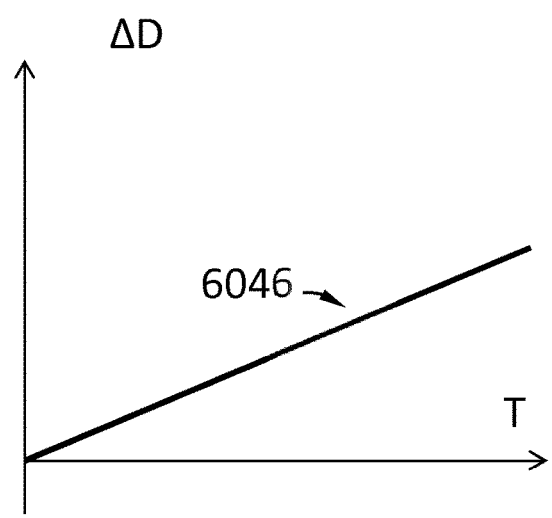

FIG. 6A shows the rate of change 6011 of the amount of electric charges deposited into two sub-regions 1050 and 1070 of the region 1000, the rate of change 6012 of the amount of electric charges dissipated from sub-region 1070, and the rate of change 6013 of the amount of electric charges dissipated from sub-region 1050. The rate of change 6012 of the amount of electric charges dissipated from sub-region 1070 is higher in its absolute value than the rate of change 6013 of the amount of electric charges dissipated from sub-region 1050 because sub-region 1070 has a lower electric resistance than sub-region 1050, as shown in FIG. 3. FIG. 6B shows the net rate of change 6022 of the amount of electric charges in sub-region 1070, and the net rate of change 6023 of the amount of electric charges in sub-region 1050. The net rate of change 6022 is the sum of the rate of change 6011 and the rate of change 6012. The net rate of change 6023 is the sum of the rate of change 6011 and the rate of change 6013. FIG. 6C shows the amount of electric charges 6033 in sub-region 1050 as a function of time T and the amount of electric charges 6032 in sub-region 1070 as a function of time T, assuming that sub-regions 1050 and 1070 have zero electric charge when T is zero. The amounts of electric charges 6032 and 6033 may be derived by integrating the net rate of changes 6022 and 6023 with respect to time T. FIG. 6C shows that the net rate of changes 6022 and 6023 may be negative (i.e., net amount of electric charges in sub-regions 1050 and 1070 may be decreasing). FIG. 6C also shows the maximum 6035 of the amount of electric charges of each of sub-regions 1050 and 1070. If the amount of charges in sub-region 1050 or sub-region 1070 exceeds the maximum 6035, an undesirable effect may occur (e.g., structures in sub-region 1050 or sub-region 1070 may be damaged). FIG. 6D shows the difference 6046 between the amount of electric charges in sub-region 1050 and the amount of electric charges in sub-region 1070, as a function of time T. FIG. 6C and FIG. 6D indicate that the difference 6046 may increase with time T, as a result of the modulation in the rate of change 6011 of the amount of electric charges deposited into sub-regions 1050 and 1070 and the disparity in the rate of change 6012 of the amount of electric charges dissipated from sub-region 1070 and the rate of change 6013 of the amount of electric charges dissipated from sub-region 1050. The presence of the maximum 6035 limits the length of time of the deposition of the electric charges into sub-regions 1050 and 1070, and thus limits the difference 6046 between the amount of electric charges in sub-region 1050 and the amount of electric charges in sub-region 1070. The expanded beam 1999 shown in FIG. 4 may be used to produce the rate of change 6011 in FIG. 6A. For example, when C2 is about zero and T2 is about half the length of T1, the expanded beam 1999 can produce the rate of change 6011 in FIG. 6A. In the example shown in FIG. 6A-FIG. 6D, the difference 6046 can reach about ⅗ of the maximum 6035. In the example shown in FIG. 6A-FIG. 6D, because no electric charges are deposited during T2 and thus the length of time of the deposition of the electric charges into sub-regions 1050 and 1070 before the maximum 6035 is exceeded is longer than the length of time of the deposition of the electric charges into sub-regions 1050 and 1070 before the maximum 5035 is exceeded in FIG. 5A-FIG. 5D. The difference 6046 and the difference 5046 monotonically increase with time T. Therefore, longer deposition leads to that difference 6046 is greater than the difference 5046.

Figure 7A:
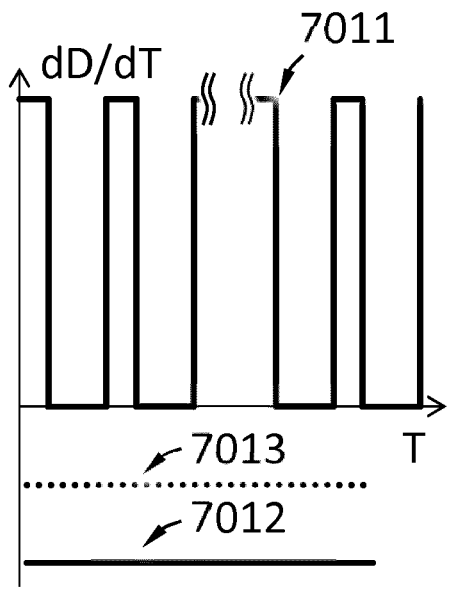
Figure 7B:
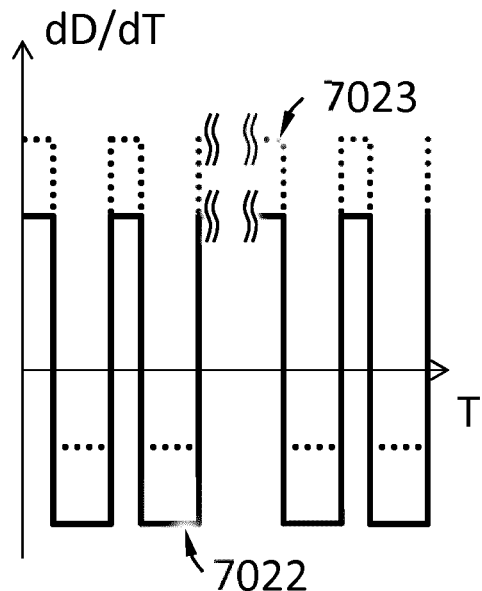
Figure 7C:
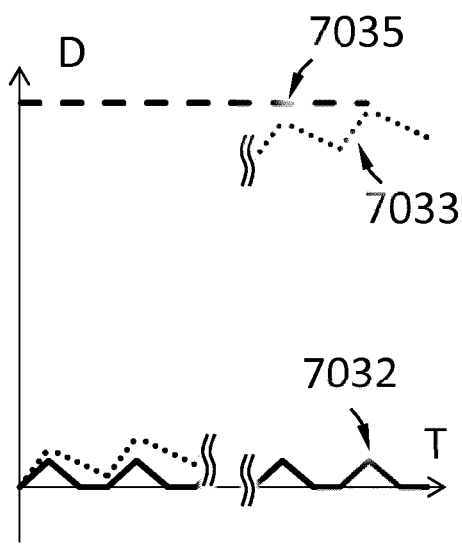
Figure 7D:
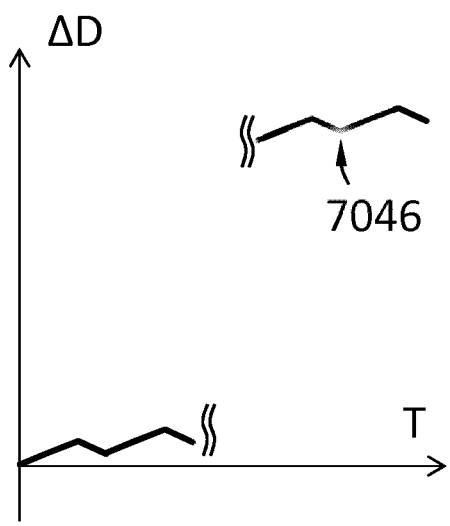

FIG. 7A shows the rate of change 7011 of the amount of electric charges deposited into two sub-regions 1050 and 1070 of the region 1000, the rate of change 7012 of the amount of electric charges dissipated from sub-region 1070, and the rate of change 7013 of the amount of electric charges dissipated from sub-region 1050. The rate of change 7012 of the amount of electric charges dissipated from sub-region 1070 is higher in its absolute value than the rate of change 7013 of the amount of electric charges dissipated from sub-region 1050 because sub-region 1070 has a lower electric resistance than sub-region 1050, as shown in FIG. 3. FIG. 7B shows the net rate of change 7022 of the amount of electric charges in sub-region 1070, and the net rate of change 7023 of the amount of electric charges in sub-region 1050. The net rate of change 7022 is the sum of the rate of change 7011 and the rate of change 7012. The net rate of change 7023 is the sum of the rate of change 7011 and the rate of change 7013. FIG. 7C shows the amount of electric charges 7033 in sub-region 1050 as a function of time T and the amount of electric charges 7032 in sub-region 1070 as a function of time T, assuming that sub-regions 1050 and 1070 have zero electric charge when T is zero. The amounts of electric charges 7032 and 7033 may be derived by integrating the net rate of changes 7022 and 7023 with respect to time T. FIG. 7C also shows the maximum 7035 of the amount of electric charges of each of sub-regions 1050 and 1070. If the amount of charges in sub-region 1050 or sub-region 1070 exceeds the maximum 7035, an undesirable effect may occur (e.g., structures in sub-region 1050 or sub-region 1070 may be damaged). FIG. 7D shows the difference 7046 between the amount of electric charges in sub-region 1050 and the amount of electric charges in sub-region 1070, as a function of time T. FIG. 7C and FIG. 7D indicate that the difference 7046 may increase with time T, as a result of the modulation in the rate of change 7011 of the amount of electric charges deposited into sub-regions 1050 and 1070 and the disparity in the rate of change 7012 of the amount of electric charges dissipated from sub-region 1070 and the rate of change 7013 of the amount of electric charges dissipated from sub-region 1050. The presence of the maximum 7035 limits the length of time of the deposition of the electric charges into sub-regions 1050 and 1070, and thus limits the difference 7046 between the amount of electric charges in sub-region 1050 and the amount of electric charges in sub-region 1070. The expanded beam 1999 shown in FIG. 4 may be used to produce the rate of change 7011 in FIG. 7A. For example, when C2 is about zero and T1 is about half the length of T2, the expanded beam 1999 can produce the rate of change 7011 in FIG. 7A. In the example shown in FIG. 7A-FIG. 7D, the difference 7046 can reach about ⅞ of the maximum 7035. In the example shown in FIG. 7A-FIG. 7D, all of the electric charges deposited onto sub-region 1070 during T1 dissipate from sub-region 1070 during T2 and thus the amount of electric charges in sub-region 1070 is zero during a part of T2. On the other hand, the amount of electric charges in sub-region 1050 increase with the number of cycles of T1 and T2 and eventually approaches the maximum 7035. Therefore, the difference 7046 can reach almost the full magnitude of the maximum 7035. Because the difference 7046 is the largest among the examples in FIG. 5A-FIG. 5D, FIG. 6A-FIG. 6D and FIG. 7A-FIG. 7D, the example in FIG. 7A-FIG. 7D would produce the largest spatial contrast in signals representing interactions of a beam of charged particles and the sample.

Figure 8:
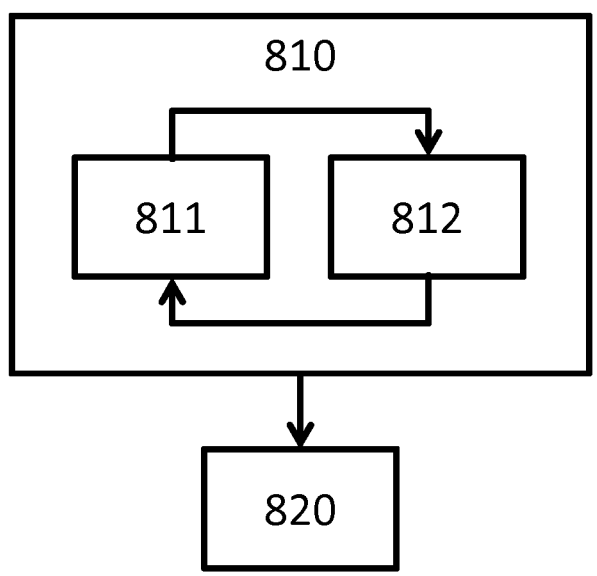
FIG. 8 shows a flowchart for a method of inspecting a sample using a beam of charged particles, according to an embodiment.

FIG. 8 shows a flowchart for a method of inspecting a sample using a beam of charged particles, according to an embodiment. In procedure 810, modulated deposition of electric charges into a region of a sample is conducted. The modulated deposition includes at least a first time period and a second period. Procedure 810 includes sub-procedure 811, in which a first amount of electric charges is deposited into the region during the first time period. Procedure 810 includes sub-procedure 812, in which a second amount of electric charges is deposited into the region during the second time period. The sub-procedure 811 and 812 may be reiterated. The average rate of deposition during the first time period (i.e., the first amount divided by the length of the first time period) is different from the average rate of deposition during the second time period (i.e., the second amount divided by the length of the second time period). The first amount or the second amount may be zero. The first amount and the second amount may be different. The length of the first time period and the length of the second time period may be different. The region may have a non-uniform spatial distribution of one or more chemical or physical characteristics. In step 820, the beam of charged particles is scanned across the region and signals representing the interactions of the charged particles and the sample are recorded. The modulated deposition in procedure 810 may be done using the same beam of charged particles used in step 820. The modulated deposition in procedure 810 may be done with a different beam from the beam of charged particles used in step 820, where the different beam may have a cross-sectional area that is at least 2 times of the cross-sectional area of the beam of charged particles used in step 820.

Figure 9:
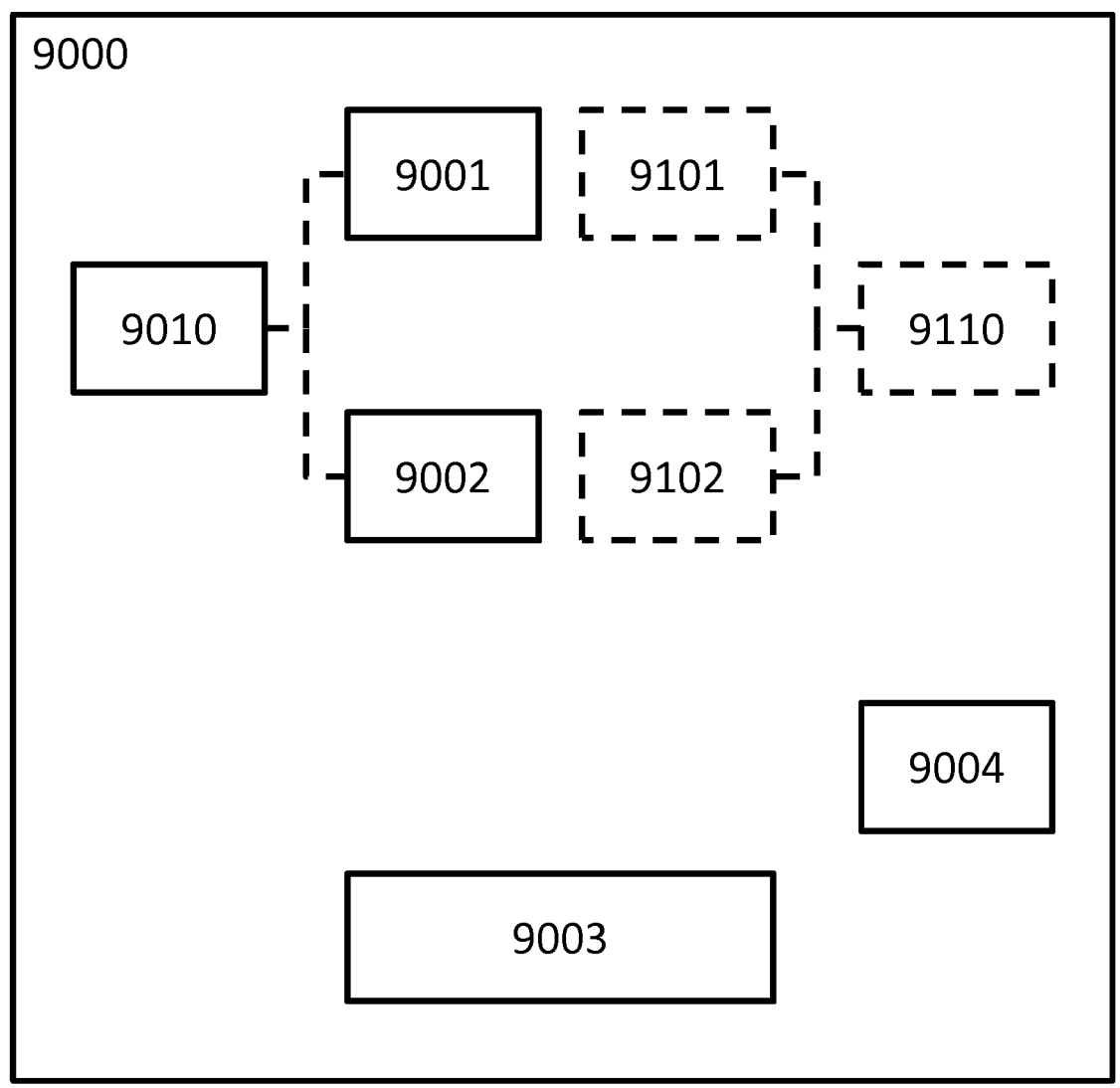
FIG. 9 schematically shows a component diagram of an apparatus configured to inspect a sample using a beam of charged particles, according to an embodiment.

FIG. 9 schematically shows a component diagram of an apparatus 9000 configured to inspect a sample using a beam of charged particles, according to an embodiment. The apparatus 9000 has a source 9001 of charged particles, a stage 9003, optics 9002 configured to direct a beam of the charged particles to a sample supported on the stage 9003. The stage 9003 may be configured to move the sample. The optics 9002 may be configured to scan a probe spot formed by the beam on the sample relative to the sample. The apparatus 9000 includes a controller 9010 configured to control the source 9001 and the optics 9002. The apparatus 9000 also includes a detector 9004 configured to record signals representing the interactions of the beam of charged particles and the sample. The source 9001, optics 9002 and controller 9010 may be configured to generate the signals to be recorded and may also be configured to conduct modulated deposition of electric charges into the sample. In an embodiment, the apparatus 9000 optionally includes another source 9101, another optics 9102 and controller 9110 dedicated to conduct modulated deposition of electric charges into the sample.

The embodiments may further be described using the following causes:

1. A method comprising:
depositing a first amount of electric charges into a region of a sample, during a first time period;
depositing a second amount of electric charges into the region, during a second time period;
while scanning a probe spot generated on the sample by a beam of charged particles, recording from the probe spot signals representing interactions of the beam of charged particles and the sample;
wherein an average rate of deposition during the first time period and an average rate of deposition during the second time period are different.

2. The method of clause 1, further comprising reiterating depositing the first amount of electric charges into the region during the first time period and depositing the second amount of electric charges into the region during the second time period.

3. The method of any one of clauses 1-2, wherein the first amount or the second amount is zero.

4. The method of any one of clauses 1-3, wherein the first amount and the second amount are different.

5. The method of any one of clauses 1-4, wherein a length of the first time period and a length of the second time period are different.

6. The method of any one of clauses 1-5, wherein the region has a non-uniform spatial distribution of a chemical characteristic or a physical characteristic.

7. The method of clause 6, wherein the chemical characteristic or the physical characteristic is selected from a group consisting of composition, doping level, electric resistance, electric capacitance, electric inductance, thickness, crystallinity, and permittivity.

8. The method of any one of clauses 1-7, wherein depositing the first amount of electric charges or depositing the second amount of electric charges is done using the beam of charged particles.

9. The method of any one of clauses 1-8, wherein depositing the first amount of electric charges or depositing the second amount of electric charges is done using another beam comprising electric charges, instead of using the beam of charged particles.

10. The method of clause 9, wherein the other beam has a cross-sectional area that is at least 2 times of a cross-sectional area of the beam of charged particles.

11. The method of any one of clauses 1-10, wherein the region comprises a first sub-region and a second sub-region, wherein a rate of change of an amount of electric charges dissipated from the first sub-region and a rate of change of an amount of electric charges dissipated from the second sub-region are different.

12. The method of any one of clauses 1-11, wherein the region comprises a first sub-region and a second sub-region, wherein a rate of change of an amount of electric charges deposited into the first sub-region and a rate of change of an amount of electric charges deposited into the second sub-region are the same.

13. The method of any one of clauses 1-12, wherein the region comprises a first sub-region and a second sub-region, wherein a net rate of change of an amount of electric charges in the first sub-region and a net rate of change of an amount of electric charges in the second sub-region are different.

14. The method of any one of clauses 1-13, wherein the region comprises a first sub-region and a second sub-region, wherein a net rate of change of an amount of electric charges in the first sub-region or a net rate of change of an amount of electric charges in the second sub-region is negative.

15. The method of any one of clauses 1-14, wherein the region comprises a first sub-region and a second sub-region, wherein a difference between an amount of electric charges in the first sub-region and an amount of electric charges in the second sub-region increases with time.

16. The method of any one of clauses 1-15, wherein the region comprises a sub-region, wherein an amount of electric charges in the sub-region is zero during a part of the second time period.

17. A computer program product comprising a non-transitory computer readable medium having instructions recorded thereon, the instructions when executed by a computer implementing the method of any of clauses 1-16.

18. An apparatus configured to inspect a sample, the apparatus comprising:

a source of charged particles;
a stage;
optics configured to direct a beam of the charged particles to a sample supported on the stage;
a controller configured to control the source and the optics; and
wherein the source, optics and controller are collectively configured to:
 depositing a first amount of electric charges into a region of the sample, during a first time period;
 depositing a second amount of electric charges into the region, during a second time period;
 wherein an average rate of deposition during the first time period and an average rate of deposition during the second time period are different.

19. The apparatus of clause 18, further comprising a detector configured to record signals representing interactions of the beam and the sample.

20. The apparatus of clause 19, wherein the source, optics and controller are collectively configured to generate the signals.

21. The apparatus of clause 19, wherein the optics are configured to scan a probe spot formed by the beam on the sample relative to the sample.

22. The apparatus of clause 19, wherein the stage is configured to move the sample.

While the concepts disclosed herein may be used for inspection on a sample such as a silicon wafer or a patterning device such as chrome on glass, it shall be understood that the disclosed concepts may be used with any type of samples, e.g., inspection of samples other than silicon wafers.

The descriptions above are intended to be illustrative, not limiting. Thus, it will be apparent to one skilled in the art that modifications may be made as described without departing from the scope of the claims set out below.

What is claimed is:

1. A method comprising:
 depositing a first amount of electric charges into a region of a sample, during a first time period;
 depositing a second amount of electric charges into the region, during a second time period; and
 while scanning a probe spot generated on the sample by a beam of charged particles, recording from the probe spot signals representing interactions of the beam of charged particles and the sample,
 wherein an average rate of deposition during the first time period and an average rate of deposition during the second time period are different, and
 wherein depositing the first amount of electric charges or depositing the second amount of electric charges is done using another beam comprising electric charges, instead of using the beam of charged particles.

2. The method of claim 1, further comprising reiterating depositing the first amount of electric charges into the region during the first time period and depositing the second amount of electric charges into the region during the second time period.

3. The method of claim 1, wherein the first amount or the second amount is zero.

4. The method of claim 1, wherein the first amount and the second amount are different.

5. The method of claim 1, wherein a length of the first time period and a length of the second time period are different.

6. The method of claim 1, wherein the region has a non-uniform spatial distribution of a chemical characteristic or a physical characteristic.

7. The method of claim 6, wherein the chemical characteristic or the physical characteristic is selected from a group consisting of composition, doping level, electric resistance, electric capacitance, electric inductance, thickness, crystallinity, and permittivity.

8. The method of claim 1, wherein the another beam has a cross-sectional area that is at least 2 times of a cross-sectional area of the beam of charged particles.

9. The method of claim 1, wherein the region comprises a first sub-region and a second sub-region, wherein a rate of change of an amount of electric charges dissipated from the first sub-region and a rate of change of an amount of electric charges dissipated from the second sub-region are different.

10. The method of claim 1, wherein the region comprises a first sub-region and a second sub-region, wherein a rate of change of an amount of electric charges deposited into the first sub-region and a rate of change of an amount of electric charges deposited into the second sub-region are the same.

11. The method of claim 1, wherein the region comprises a first sub-region and a second sub-region, wherein a net rate of change of an amount of electric charges in the first sub-region or a net rate of change of an amount of electric charges in the second sub-region is negative.

12. The method of claim 1, wherein the region comprises a first sub-region and a second sub-region, wherein a difference between an amount of electric charges in the first sub-region and an amount of electric charges in the second sub-region increases with time.

13. An apparatus configured to inspect a sample, the apparatus comprising:
 a source of charged particles;
 a stage;
 optics configured to direct a beam of the charged particles to a sample supported on the stage; and
 a controller configured to control the source and the optics,
 wherein the source, optics and controller are collectively configured to:
  deposit a first amount of electric charges into a region of the sample, during a first time period, and
  deposit a second amount of electric charges into the region, during a second time period,
 wherein an average rate of deposition during the first time period and an average rate of deposition during the second time period are different, and
 wherein the depositing of the first amount of electric charges or the depositing of the second amount of electric charges is done using another beam comprising electric charges, instead of using the beam of charged particles for scanning a probe spot on the sample.

* * * * *